(12) United States Patent
Kang et al.

(10) Patent No.: US 10,610,909 B2
(45) Date of Patent: Apr. 7, 2020

(54) WASHER IDLER ROLLER AND WAFER CLEANER USING SAME

(71) Applicants: Gyeong-Tae Kang, Incheon (KR); Yoon-Sik Kim, Incheon (KR)

(72) Inventors: Gyeong-Tae Kang, Incheon (KR); In-Boon Ha, Incheon (KR)

(73) Assignees: Gyeong-Tae Kang, Incheon (KR); Yoon-Sik Kim, Incheon (KR)

( * ) Notice: Subject to any disclaimer, the term of this patent is extended or adjusted under 35 U.S.C. 154(b) by 60 days.

(21) Appl. No.: 15/746,969

(22) PCT Filed: Oct. 25, 2017

(86) PCT No.: PCT/KR2017/011799
§ 371 (c)(1),
(2) Date: Jan. 23, 2018

(87) PCT Pub. No.: WO2018/080147
PCT Pub. Date: May 3, 2018

(65) Prior Publication Data
US 2018/0339319 A1    Nov. 29, 2018

(30) Foreign Application Priority Data
Oct. 27, 2016 (KR) ........................ 10-2016-0140998

(51) Int. Cl.
*H01L 21/67* (2006.01)
*B08B 11/00* (2006.01)

(52) U.S. Cl.
CPC ........ *B08B 11/00* (2013.01); *H01L 21/67046* (2013.01); *H01L 21/67051* (2013.01); *H01L 21/67253* (2013.01)

(58) Field of Classification Search
CPC ..... B08B 1/04; B08B 1/002; H01L 21/67046; H01L 21/67051
See application file for complete search history.

(56) References Cited

U.S. PATENT DOCUMENTS

| | | | |
|---|---|---|---|
| 6,059,889 A | 5/2000 | Jensen et al. | |
| 6,918,864 B1 | 7/2005 | Brian et al. | |
| 2005/0087212 A1 | 4/2005 | Yudovsky et al. | |
| 2011/0079245 A1 | 4/2011 | Karuppiah et al. | |

FOREIGN PATENT DOCUMENTS

| | | |
|---|---|---|
| JP | 2000-517475 A | 12/2000 |
| JP | 2013-506997 A | 2/2013 |
| KR | 10-2008-0109181 A | 12/2008 |

*Primary Examiner* — Mikhail Kornakov
*Assistant Examiner* — Natasha N Campbell
(74) *Attorney, Agent, or Firm* — Rabin & Berdo, P.C.

(57) ABSTRACT

Disclosed is a washer idler roller and a wafer cleaner using the same in which the wafer cleaner prevents wafer slip and wafer hunting so that the wafer rotates stably, and it is possible to efficiently determine whether the wafer is clean or not by precise detection of a rotation state of the wafer. The wafer cleaner of semiconductor manufacturing equipment according to the present invention includes a wafer roller for rotating the wafer, an idler detecting a rotation speed of the wafer, and brushes respectively disposed at opposite sides of the wafer, wherein the idler includes a first body configured to rotate, a pair of first guide portions disposed at the first body, and a washer idler roller disposed between the first guide portions and being in contact with an outer circumferential surface of the wafer.

1 Claim, 7 Drawing Sheets

"Conventional Art"

216

WASHER IDLER ROLLER AND WAFER CLEANER USING SAME

TECHNICAL FIELD

The present invention relates to a washer idler roller and a wafer cleaner using the same. More particularly, the present invention relates to a washer idler roller and a wafer cleaner using the same in which the wafer cleaner prevents wafer slip and wafer hunting so that the wafer rotates stably, and it is possible to efficiently determine whether the wafer is clean or not by precise detection of a rotation state of the wafer.

BACKGROUND ART

A semiconductor manufacturing process generally includes a brushing process as a method to remove particles on a surface of a wafer. In the brushing process, a brush is moved to a position where the wafer is disposed and then the brush is rotated. Then, deionized water (DI water) and chemical diluent are dispersed in order to remove particles. Before the brush is driven to move to the position where the wafer is disposed, the brush is rotated constantly at a brush origin state, that is, a home position state.

A back surface of the wafer is required to be clean in order to clean and to process a front surface of the wafer without flaws. Substances attached to the back surface of the wafer are removed during processing and contaminate the front surface of the wafer.

When proceeding with a lithography process to realize an ultra-fine circuit, the substances of the back surface of a wafer causes a deformation of the wafer and being out of focus locally, so a desired circuit pattern is unable to be obtained. Therefore, the substances of the back surface of the wafer are required to be removed.

Conventionally, a process for removing the substances of the back surface of the wafer in a semiconductor manufacturing process is the only process cleaning with soft sponges. In such process, only particles combined with weak physical force are removed without polishing, so particles strongly combined with the back surface of the wafer are not removed, thereby causing process defects.

Therefore, in an effort to solve such problems, Korean Patent Application Publication No. 10-2008-0109181 proposed a device for cleaning wafer face of semiconductor production equipment. As shown in FIG. 1 of the accompanying drawings, the device includes wafer rollers 30 and 32 for rotating a wafer 50, a first brush 36 and a second brush 38 respectively disposed in order to contact with opposite surfaces of the wafer 50 and polishing each surface of the wafer 50 with received abrasives while contacting therewith when the wafer 50 rotates, a first jet nozzle 40 and a second jet nozzle 42 each disposed in order to supply and spray the abrasives between the first brush 36 and a surface of the wafer 50, and between the second brush 38 and the other surface of the wafer 50, and an idler 34 contacting with the wafer 50 disposed between the wafer rollers 30 and 32 and rotated by contact with the wafer 50.

However, the technique disclosed in Korean Patent Application Publication No. 10-2008-0109181 has an advantage that as the wafer 50 is rotated by the wafer rollers 30 and 32, the both surfaces of the wafer 50 are cleaned by the first brush 36 and the second brush 38, so particles of the both surfaces of the wafer are cleaned at the same time. However, the particles separated from the wafer 50 may enter the wafer rollers 30 and 32 such that the wafer slips, and the wafer 50 rotates abnormally due to hunting phenomenon in which the wafer 50 is ejected from the cleaner, so stable cleaning is impossible. In addition, when the particles enter between the wafer 50 and the idler 34, a rotation detecting device interlocking with the idler 34 cannot detect a rotation state of the wafer 50 exactly by slipping of the wafer 50 due to the particles, so an incomplete cleaning process cannot be detected.

DISCLOSURE

Technical Problem

Accordingly, the present invention has been made keeping in mind the above problems occurring in the related art, and an object of the present invention is to provide a wafer cleaner including a pair of brushes respectively disposed at opposite surfaces of a wafer, rotated by a wafer roller, and removing particles attached to a surface of the wafer, and an idler disposed at a lower portion of the wafer and detecting a rotation of the wafer, wherein the idler includes a washer idler roller provided with an inserting groove, formed along a center of an outer circumferential surface thereof and in which an edge of the wafer is inserted, and the washer idler roller is also provided with a first discharging groove configured to penetrate to an outside of the washer idler roller to lead to the inserting groove such that the particles entered into the inserting groove are discharged. Therefore, the wafer cleaner prevents wafer slip and wafer hunting and it is possible to efficiently detect whether the wafer is clean or not in a stable state.

In addition, another object of the present invention is to provide a wafer cleaner including the wafer roller for rotating the wafer, in which the wafer roller includes a second body, a pair of second guide portions disposed at the second body, and a wafer drive roller disposed between the second guide portions. More specifically, each of the second guide portions is provided with a sloped surface on an inner surface thereof and the wafer drive roller is composed of a viscous material such as silicone and rubber, thereby rotating the wafer stably while contacting with the edge of the wafer, and the wafer drive roller includes an uneven pattern on an outer circumferential surface thereof, so when the particles separated from the wafer enter into the wafer roller, the particles are accumulated at a recessed part of the uneven pattern, thereby preventing wafer slip such that the wafer rotates stably.

Technical Solution

In order to accomplish the above and other objects,
a washer idler roller used in a wafer cleaner is provided with an inserting groove formed along a center of an outer circumferential surface thereof such that an edge of a wafer is inserted therein.

The washer idler roller may be provided with first discharging grooves configured to penetrate to an outside of the washer idler roller to lead to the inserting groove.

Meanwhile, a wafer cleaner of semiconductor manufacturing equipment includes a wafer roller for rotating a wafer, an idler detecting a rotation speed of the wafer, and brushes respectively disposed at opposite sides of the wafer.

The idler may include a first body configured to rotate, a pair of first guide portions disposed at the first body, and a washer idler roller disposed between the first guide portions and being in contact with an outer circumferential surface of the wafer.

The washer idler roller may be provided with an inserting groove formed along a center of an outer circumferential surface thereof such that an edge of the wafer is inserted therein.

The washer idler roller may be provided with first discharging grooves configured to penetrate to an outside of the washer idler roller to lead to the inserting groove.

The first guide portions may be provided with a first fit groove in which the washer idler roller is inserted.

The wafer roller may include a second body configured to rotate a pair of second guide portions disposed at the second body, and a wafer drive roller disposed between the second guide portions and being in contact with an outer circumferential surface of the wafer.

The wafer drive roller may include an uneven pattern on an outer circumferential surface thereof.

Each of the second guide portions may be provided with a sloped surface on an inner surface thereof and the sloped surface is provided with second discharging grooves spaced at regular intervals.

Advantageous Effects

According to the present invention having above-mentioned construction, the wafer cleaner includes a pair of brushes disposed at each surface of a wafer, rotated by a wafer roller, and removing particles attached to a surface of the wafer, and an idler disposed at a lower portion of the wafer and detecting a rotation of the wafer, wherein the idler includes a washer idler roller provided with an inserting groove, formed along a center of an outer circumferential surface thereof and in which an edge of the wafer is inserted, and the washer idler roller is also provided with a first discharging groove configured to penetrate to an outside of the washer idler roller to lead to the inserting groove such that the particles entered into the inserting groove are discharged. Therefore, the wafer cleaner prevents wafer slip and wafer hunting and detects whether the wafer is clean or not in a stable state.

In addition, the wafer cleaner according to the present invention includes the wafer roller for rotating the wafer, wherein the wafer roller includes a second body, a pair of second guide portions disposed at the second body, and a wafer drive roller disposed between the second guide portions. More specifically, each of the second guide portions is provided with a sloped surface on an inner surface thereof and the wafer drive roller is composed of a viscous material such as silicone and rubber, thereby rotating the wafer stably while contacting with the edge of the wafer, and the wafer drive roller includes an uneven pattern on an outer circumferential surface thereof, so when the particles separated from the wafer entered into the wafer roller, the particles are accumulated at a recessed part of the uneven pattern, thereby preventing wafer slip so that the wafer rotates stably.

BEST MODE

Figure 1:
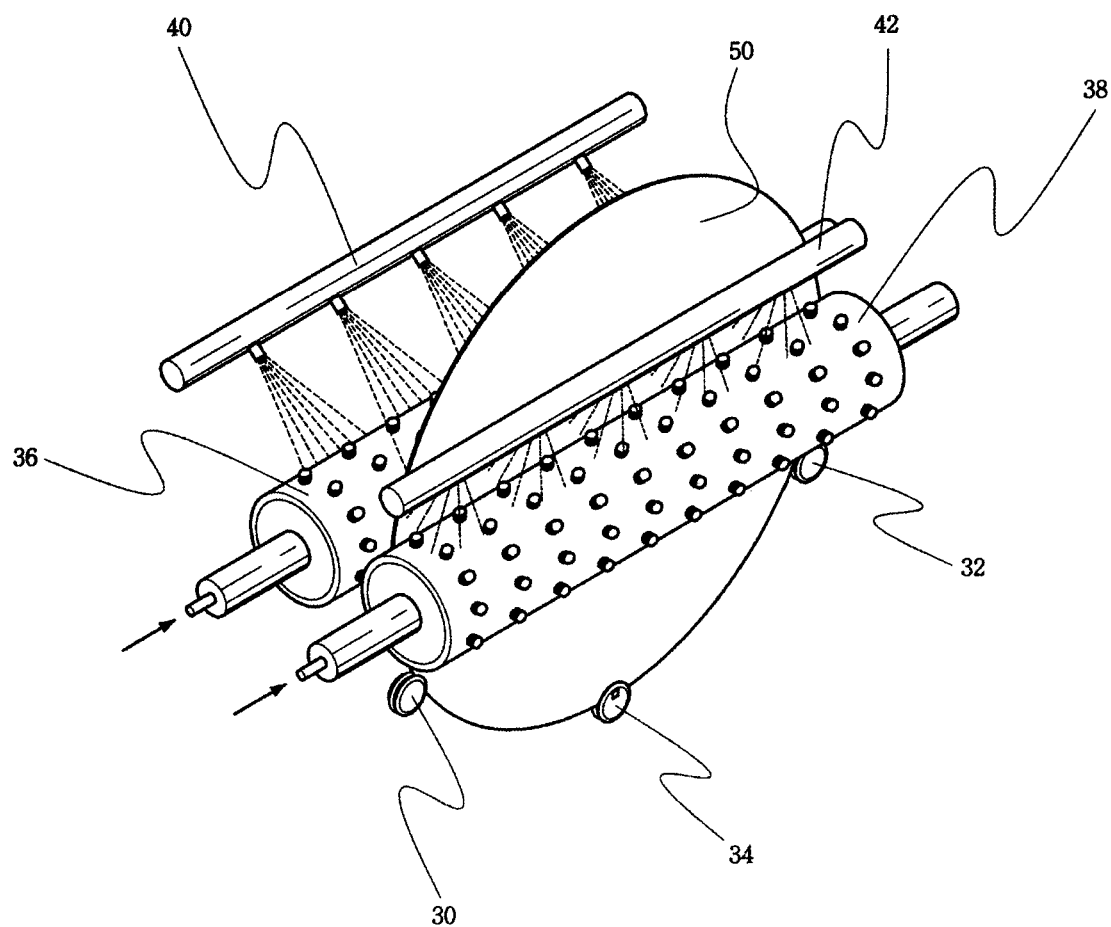
FIG. 1 is a perspective view of a conventional wafer cleaner.

Hereinafter, an embodiment of the present invention will be described with reference to the accompanying drawings. The same reference numerals will be used throughout the drawings about the same or like elements or parts of the conventional structure, and a detailed description of those same elements will be omitted. It should be understood that the embodiment of the present invention may be changed to a variety of embodiments and the scope and spirit of the present invention are not limited to the embodiment described hereinbelow.

Figure 2:
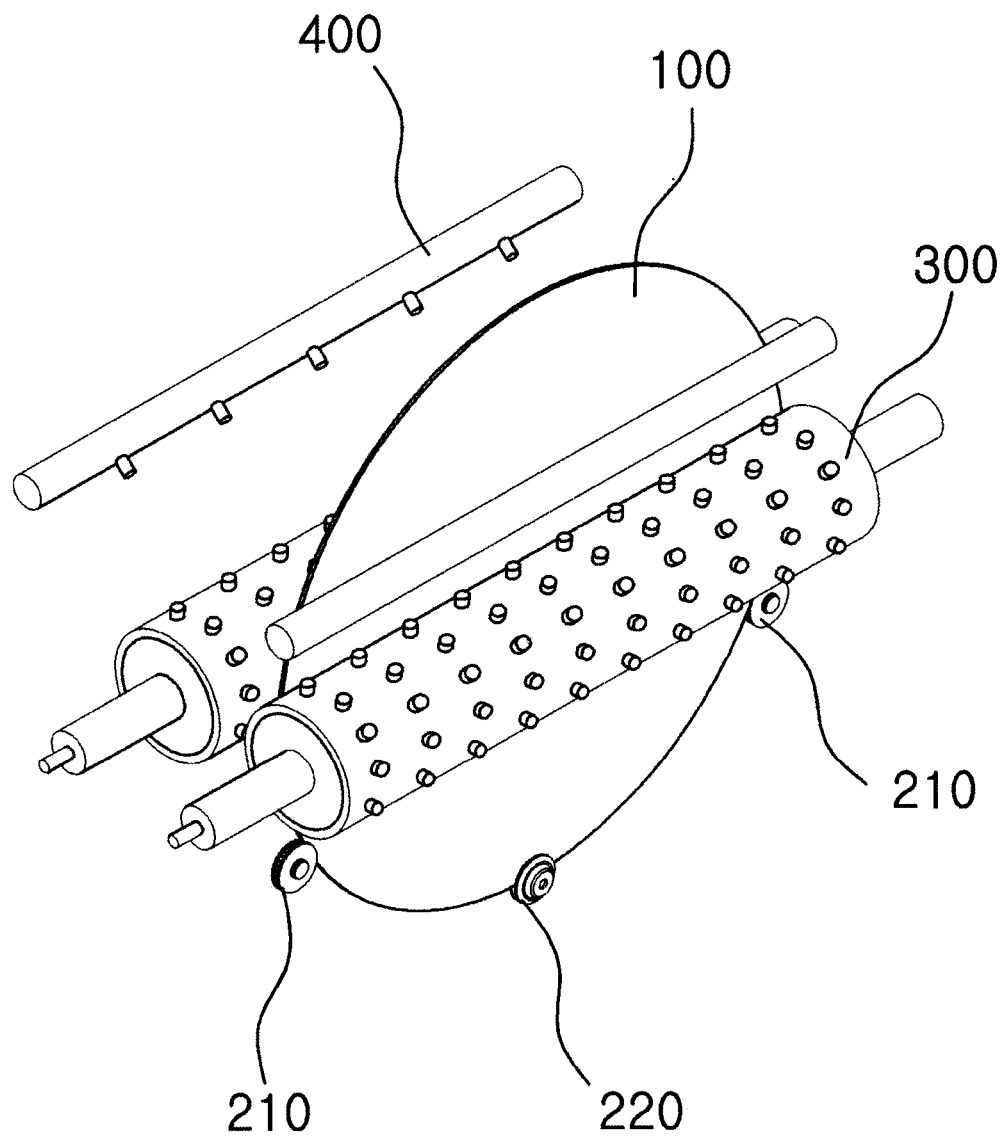
FIG. 2 is a perspective view of a wafer cleaner according to the present invention.
Figure 3:
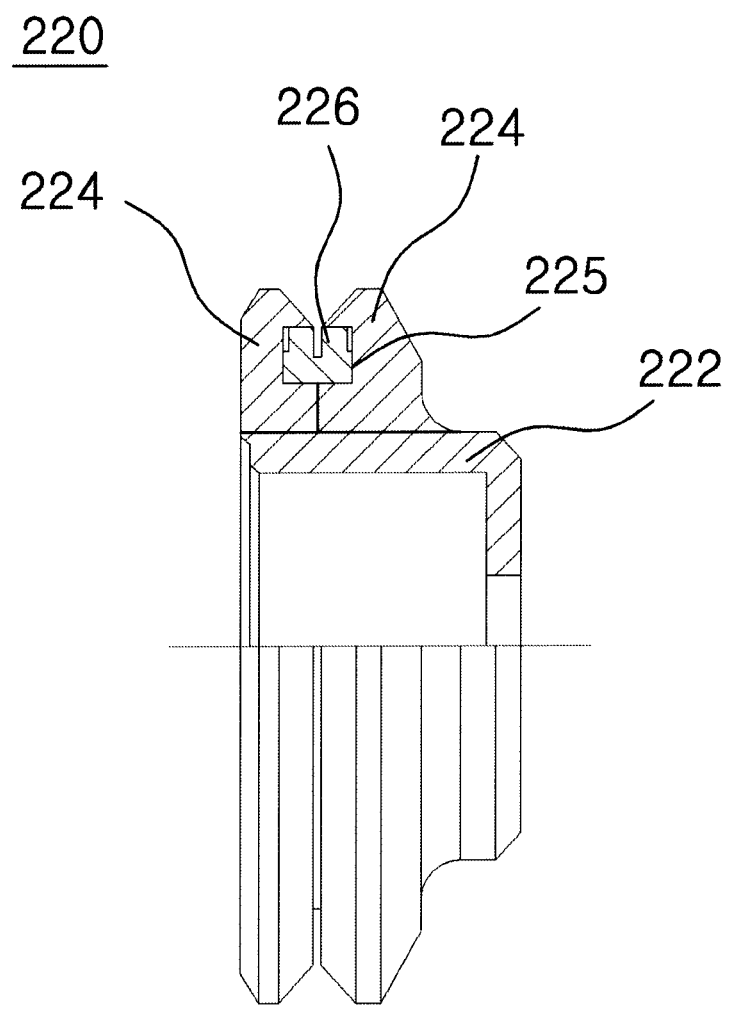
FIG. 3 is a partially sectional view showing an idler of the wafer cleaner according to the present invention.
Figure 4:
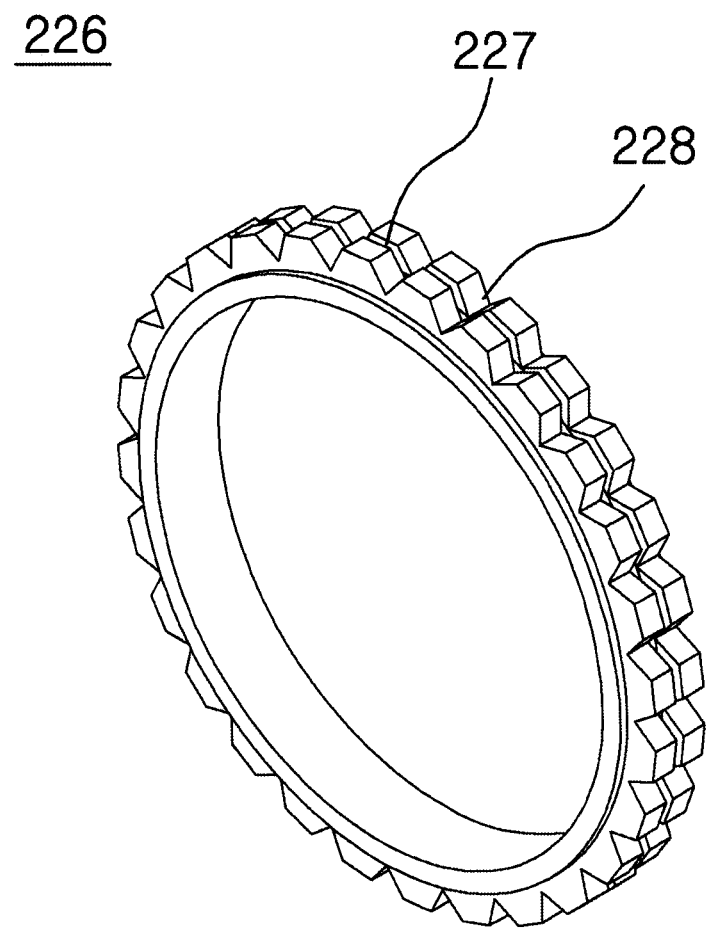
FIG. 4 is a perspective view showing a washer idler roller of the idler of the wafer cleaner according to the present invention.
Figure 5:
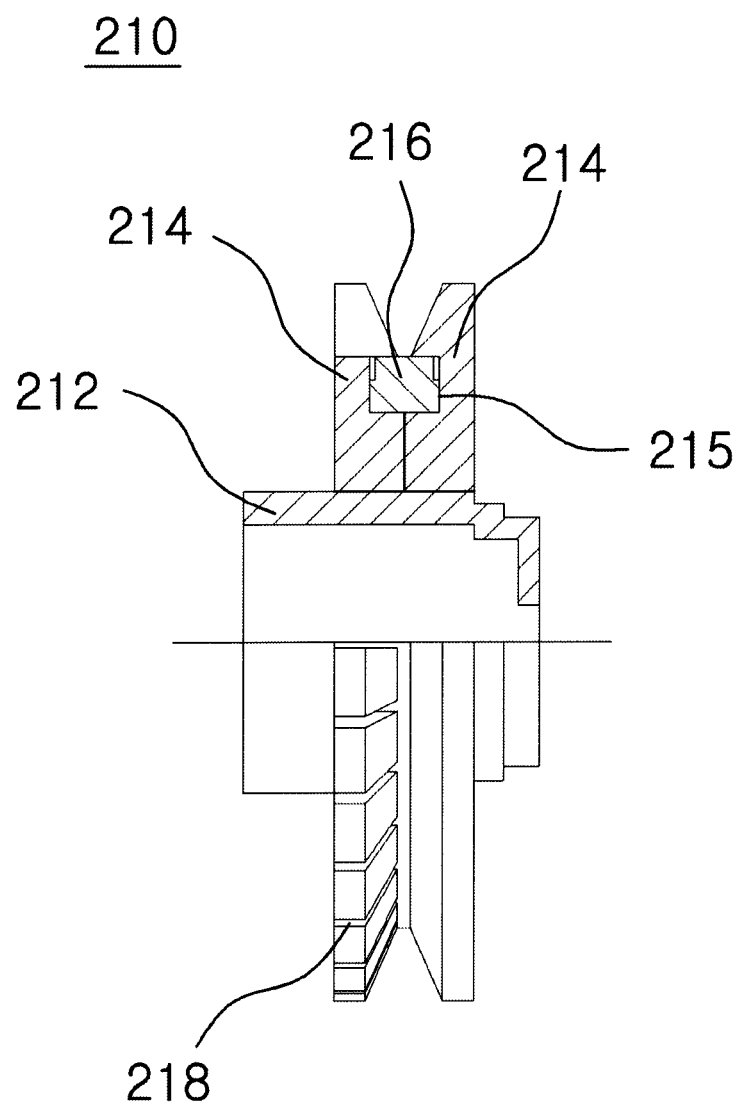
FIG. 5 is partially sectional view showing a wafer roller of the wafer cleaner according to the present invention.
Figure 6:
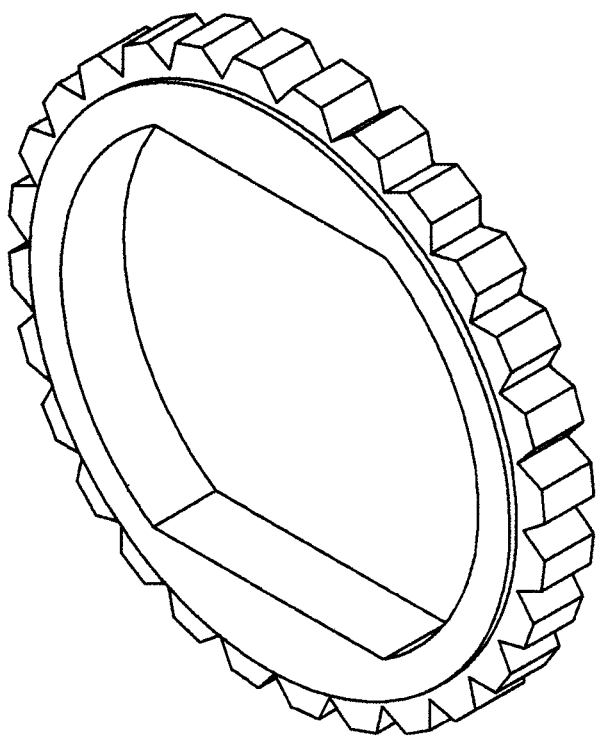
FIG. 6 is a perspective view of a wafer drive roller of the wafer roller of the wafer cleaner according to the present invention.
Figure 7:
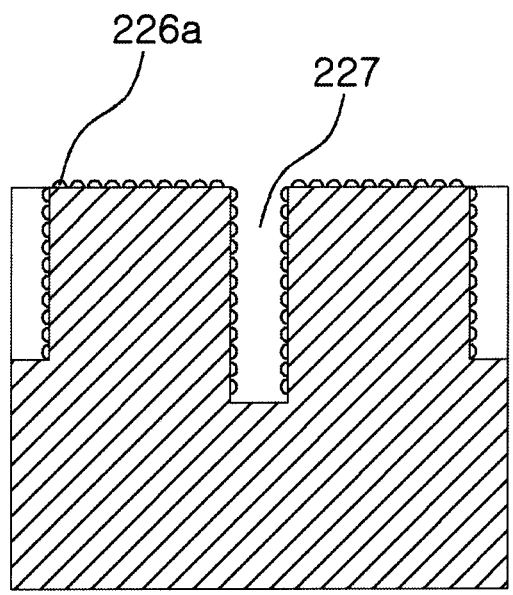
FIG. 7 is a partially enlarged sectional view showing a washer idler roller of an idler of a wafer cleaner according to another embodiment of the present invention.

FIG. 2 is a perspective view of a wafer cleaner according to the present invention, FIG. 3 is a partially sectional view showing an idler of the wafer cleaner according to the present invention, FIG. 4 is a perspective view showing a washer idler roller of the idler of the wafer cleaner according to the present invention, FIG. 5 is partially sectional view showing a wafer roller of the wafer cleaner according to the present invention, FIG. 6 is a perspective view of a wafer drive roller of the wafer roller of the wafer cleaner according to the present invention, and FIG. 7 is a partially enlarged sectional view showing a washer idler roller of an idler of a wafer cleaner according to another embodiment of the present invention.

The present invention relates to a wafer cleaner for cleaning a wafer 100 of semiconductor manufacturing equipment. As shown in FIG. 2, the structure of the wafer cleaner includes a wafer roller 210 for rotating the wafer 100, an idler 220 detecting a rotation speed of the wafer 100, and brushes 300 respectively disposed at opposite sides of the wafer 100.

Here, the brushes 300, the wafer roller 210, and the idler 220 disposed inside a housing provided separately and not shown in figures clean particles attached to opposite surfaces of the wafer 100 while rotating the supplied wafer 100.

At this point, each supply line (not shown) is provided inside the brushes 300. Deionized water (DI water) for cleaning may be supplied through the brushes 300, or may be supplied through a jet nozzle 400 provided separately as shown in FIG. 2 to clean the wafer 100.

Meanwhile, the idler 220 detects the rotation speed of the wafer 300 by the wafer roller 210. As shown in FIGS. 3 and 4, the idler 220 includes a first body 222 configured to rotate, a pair of first guide portions 224 disposed at the first body 222, and a washer idler roller 226 disposed between the first guide portions 224.

The washer idler roller 226 may be composed of a viscous material such as silicone, rubber, and synthetic rubber. Such a viscous property efficiently delivers a torque of the wafer 100 to the idler 220.

The washer idler roller 226 is provided with an inserting groove 227 formed along a center of an outer circumferential surface thereof. An edge of the wafer 100 is inserted into the inserting groove 227 so as to increase a frictional force with the wafer 100, thereby efficiently delivering the torque of the wafer 100 to the washer idler roller 226.

In addition, the washer idler roller 226 is provided with first discharging grooves 228 configured to penetrate to an outside of the washer idler roller 226 to lead to the inserting groove 227. The particles entered into the inserting groove 227 of the washer idler roller 226 are discharged through the first discharging grooves 228.

That is, the edge of the wafer 100 is inserted into the inserting groove 227 of the washer idler roller 226 so as to increase the frictional force with the wafer 100, thereby efficiently delivering the torque of the wafer 100 to the washer idler roller 226. In addition, the particles entered into the inserting groove 227 are discharged through the first discharging grooves 228 provided at side portion of the inserting groove 227, thereby efficiently preventing wafer slip due to particles disposed between the wafer 100 and the washer idler roller 226.

Therefore, the torque of the wafer 100 is delivered to the washer idler roller 226 accurately by the inserting groove 227 of the washer idler roller 226 and the first discharging grooves 228. Accordingly, the idler 220 rotates with the washer idler roller 226 at the same time, thereby precisely determining the number of rotations of the wafer 100 and also precisely determining a clean state of the wafer 100.

Here, the first discharging grooves 228 may be formed at one side of the inserting groove 227 or at both sides of the inserting groove 227 as shown in FIG. 4. A protruding part (reference numeral not shown) formed by the first discharging grooves 228 may be configured to be a trapezoid shape as shown in drawing, or a triangle shape by forming a gap of the first discharging grooves 228 to be tapered, or a square shape forming the shape of the first discharging grooves 228 to be a square shape.

In addition, as shown in FIG. 7, another embodiment of the present invention may provide embossments 266a on a surface of the washer idler roller 226. The embossments 266a efficiently prevent slip of the wafer 100 on the particles entering into the inserting groove 227 and hunting phenomenon, in which the wafer 100 is ejected from the inserting groove 227.

At this point, the embossments 226a prevent hydroplaning on a surface of the inserting groove 227 and the surface of the washer idler roller 226 due to the DI water, etc. dispersed to clean the wafer 100, thereby efficiently preventing wafer slip.

In addition, a rotation detecting portion (not shown) is provided on a surface of the idler 220 and detects the rotation speed of the idler 220 by a rotation detecting device (not shown) provided separately.

Meanwhile, the rotation speed may be detected by various devices such as a conventional encoder, not only the rotation detecting portion.

A first fit groove 225 is provided on a facing surface of the pair of first guide portions 224 and the washer idler roller 226 is inserted into the first fit groove 225. The inserting groove 227 of the washer idler roller 226 and a gap between the first guide portions 224 are configured to be same, so the wafer 100 is easily inserted into the inserting groove 227 of the washer idler roller 226.

That is, each edge of a facing surface of the first guide portions 224 is provided to be sloped and each sloped lower portion of the first guide portions 224 is separated from each other. Since the gap between the first guide portions 224 is configured to be same with the inserting groove 227 of the washer idler roller 226, the wafer 100 inserted along the sloped facing surface of the first guide portions 224 is efficiently inserted into the inserting groove 227 of the washer idler roller 226.

Here, one of first guide portions 224 is configured to be detachable from the first body 222 whereby the washer idler roller 226 is detachable.

As shown in FIGS. 5 and 6, the wafer roller 210 includes a second body 212 configured to rotate, a pair of second guide portions 214 disposed at the second body 212, and a wafer drive roller 216 disposed between the second guide portions 214.

The wafer drive roller 216 may be composed of a viscous material such as silicone, rubber, and synthetic rubber. Such a viscous property efficiently delivers a torque of the wafer roller 210 to the wafer 100 whereby the wafer 100 rotates.

The wafer drive roller 216 includes an uneven pattern on an outer circumferential surface thereof. The particles are accumulated at a recessed part of the uneven pattern when the particles separated during cleaning process of the wafer 100 are entered to the wafer roller 210, and the edge of the wafer 100 contacts with a prominent part of the uneven pattern, thereby efficiently preventing wafer slip due to the particles.

In addition, each of the second guide portions 214 is provided with a sloped surface on an inner surface thereof, so the wafer 100 is entered between the sloped surfaces of the guide portions 214 easily and the edge of wafer 100 is stably in contact with the outer circumferential surface of the wafer drive roller 216. The sloped surface of each second guide portion 214 is provided with second discharging grooves 218 spaced at regular intervals, so the particles entered into the wafer roller 210 are discharged easily.

A second fit groove 215 is provided on an facing surface of the pair of the second guide portions 214 and the wafer drive roller 216 is inserted into the second fit groove 215.

Although the preferred embodiment of the present invention have been disclosed for illustrative purposes, those skilled in the art will appreciate that various modifications, additions and substitutions are possible, without departing from the scope and spirit of the invention as disclosed in the accompanying claims. It is thus well known to those skilled in that art that the present invention is not limited to the embodiment disclosed in the detailed description, and the patent right of the present invention should be defined by the scope and spirit of the invention as disclosed in the accompanying claims.

INDUSTRIAL APPLICABILITY

The present invention relates to a washer idler roller and a wafer cleaner using the same. More particularly, the present invention relates to a washer idler roller and a wafer cleaner using the same in which the wafer cleaner prevents wafer slip and wafer hunting so that the wafer rotates stably, and it is possible to efficiently determine whether the wafer is clean or not by precise detection of a rotation state of the wafer.

What is claimed is:

1. An apparatus for cleaning a wafer, the apparatus comprising:
   a wafer roller for rotating a wafer;
   an idler for detecting a rotation speed of the wafer; and
   a brush for cleaning the wafer, wherein the idler comprises:
   a first body for rotating;
   a pair of first guide portions disposed at the first body; and
   a washer idler roller disposed between the first guide portions and being in contact with an outer circumferential surface of the wafer, wherein the washer idler roller is formed with an inserting groove formed along a center of an outer circumferential surface thereof such that an edge of a wafer is inserted therein;

the washer idler roller has first discharging grooves formed to discharge a particle to an outside of the washer idler roller along the inserting groove, and the wafer roller includes:

a second body for rotating;

a pair of second guide portions disposed at the second body; and a wafer drive roller disposed between the pair of second guide portions and being in contact with an outer circumferential surface of the wafer, wherein the wafer drive roller includes an uneven pattern on an outer circumferential surface thereof, and the pair of second guide portions are formed with a sloped surface on an inner surface thereof and the sloped surface is formed with second discharging grooves spaced at regular intervals, and wherein the uneven pattern comprises a plurality of substantially V-shaped depressions in the outer circumferential surface of the washer drive roller;

the first discharging grooves are configured to penetrate to an outside of the washer idler roller to lead to the inserting groove;

the first guide portions are provided with a first fit groove in which the washer idler roller is inserted;

the first discharging grooves of the washer idler rollers are formed as substantially shaped depressions in an outer circumferential surface of the washer idler roller;

the substantially V-shaped depressions of the uneven pattern on the outer circumferential surface of the wafer drive roller are opposite the second discharging grooves; and a surface of the inserting, groove has embossments.

* * * * *